(12) United States Patent
Schoner et al.

(10) Patent No.: US 11,876,116 B2
(45) Date of Patent: Jan. 16, 2024

(54) METHOD FOR MANUFACTURING A GRID

(71) Applicant: II-VI Delaware, Inc., Wilmington, DE (US)

(72) Inventors: Adolf Schoner, Hässelby (SE); Sergey Reshanov, Upplands-Väsby (SE); Nicolas Thierry-Jebali, Stockholm (SE); Hossein Elahipanah, Sollentuna (SE)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

(21) Appl. No.: 17/660,888

(22) Filed: Apr. 27, 2022

(65) Prior Publication Data
US 2022/0254887 A1 Aug. 11, 2022

Related U.S. Application Data

(63) Continuation of application No. 16/647,094, filed as application No. PCT/EP2018/074908 on Sep. 14, 2018, now Pat. No. 11,342,423.

(30) Foreign Application Priority Data

Sep. 15, 2017 (SE) ..................................... 17511387

(51) Int. Cl.
*H01L 21/00* (2006.01)
*H01L 29/40* (2006.01)
(Continued)

(52) U.S. Cl.
CPC ...... *H01L 29/402* (2013.01); *H01L 21/02529* (2013.01); *H01L 21/02634* (2013.01);
(Continued)

(58) Field of Classification Search
CPC ............. H01L 29/402; H01L 21/02529; H01L 21/02634; H01L 21/28537;
(Continued)

(56) References Cited

U.S. PATENT DOCUMENTS 2,705,406 A 4/1955 Morrison
5,693,569 A 12/1997 Ueno
(Continued)

FOREIGN PATENT DOCUMENTS

CN 103000698 A 3/2013
CN 103606551 A 2/2014
(Continued)

OTHER PUBLICATIONS

Bakowski, "Prospects and Development of Vertical Normally-off JFETs in SiC," Journal of Telecommunications and Information Technology, Apr. 2009, pp. 25-36.
(Continued)

*Primary Examiner* — Richard A Booth
(74) *Attorney, Agent, or Firm* — Blank Rome LLP

(57) ABSTRACT

A grid is manufactured with a combination of ion implant and epitaxy growth. The grid structure is made in a SiC semiconductor material with the steps of a) providing a substrate comprising a doped semiconductor SiC material, said substrate comprising a first layer (n1), b) by epitaxial growth adding at least one doped semiconductor SiC material to form separated second regions (p2) on the first layer (n1), if necessary with aid of removing parts of the added semiconductor material to form separated second regions (p2) on the first layer (n1), and c) by ion implantation at least once at a stage selected from the group consisting of directly after step a), and directly after step b); implanting ions in the first layer (n1) to form first regions (p1). It is possible to manufacture a grid with rounded corners as well as an upper
(Continued)

part with a high doping level. It is possible to manufacture a component with efficient voltage blocking, high current conduction, low total resistance, high surge current capability, and fast switching.

16 Claims, 2 Drawing Sheets

(51) Int. Cl.
| | | |
|---|---|---|
| H01L 21/02 | (2006.01) | |
| H01L 21/265 | (2006.01) | |
| H01L 21/285 | (2006.01) | |
| H01L 21/306 | (2006.01) | |
| H01L 21/3065 | (2006.01) | |
| H01L 21/324 | (2006.01) | |

(52) U.S. Cl.
CPC .. *H01L 21/26513* (2013.01); *H01L 21/28537* (2013.01); *H01L 21/3065* (2013.01); *H01L 21/30625* (2013.01); *H01L 21/324* (2013.01); *H01L 29/401* (2013.01)

(58) Field of Classification Search
CPC .......... H01L 21/30625; H01L 21/3065; H01L 21/324; H01L 29/401
See application file for complete search history.

(56) References Cited

U.S. PATENT DOCUMENTS

| | | |
|---|---|---|
| 6,049,108 A | 4/2000 | Williams et al. |
| 6,091,108 A | 7/2000 | Harris et al. |
| 6,104,043 A | 8/2000 | Hermansson et al. |
| 6,673,662 B2 | 1/2004 | Singh |
| 6,897,133 B2 | 5/2005 | Collard |
| 6,936,850 B2 | 8/2005 | Friedrichs et al. |
| 6,979,863 B2 | 12/2005 | Ryu |
| 7,851,881 B1 | 12/2010 | Zhao et al. |
| 8,384,182 B2 | 2/2013 | Mazzola et al. |
| 8,633,560 B2 | 1/2014 | Aketa |
| 8,704,295 B1 | 4/2014 | Darwish et al. |
| 9,385,244 B2 | 7/2016 | Hirakata |
| 9,577,046 B1 | 2/2017 | Hori et al. |
| 10,243,035 B2 | 3/2019 | Murakami et al. |
| 10,522,673 B2 | 12/2019 | Kobayashi et al. |
| 2003/0201464 A1 | 10/2003 | Hokomoto |
| 2006/0255423 A1 | 11/2006 | Ryu et al. |
| 2007/0001194 A1 | 1/2007 | Ono et al. |
| 2007/0029573 A1 | 2/2007 | Cheng et al. |
| 2007/0170436 A1 | 7/2007 | Sugawara |
| 2007/0228505 A1 | 10/2007 | Mazzola et al. |
| 2011/0021533 A1 | 1/2011 | Cook et al. |
| 2013/0270577 A1 | 10/2013 | Svederg et al. |
| 2014/0138705 A1 | 5/2014 | Zhang et al. |
| 2014/0169045 A1 | 6/2014 | Ueno |
| 2014/0264564 A1 | 9/2014 | Cheng et al. |
| 2014/0367771 A1 | 12/2014 | Chatty et al. |
| 2015/0263180 A1* | 9/2015 | Hirakata .............. H01L 29/1608 257/77 |
| 2016/0126347 A1 | 5/2016 | Wada et al. |
| 2016/0233210 A1 | 8/2016 | Matocha et al. |

FOREIGN PATENT DOCUMENTS

| | | |
|---|---|---|
| EP | 2058854 A2 | 5/2009 |
| EP | 2075847 A1 | 7/2009 |
| JP | H09191109 A | 7/1997 |
| JP | 2009532902 A | 9/2009 |
| JP | 2015173158 A | 10/2015 |
| WO | 199832177 | 7/1998 |
| WO | 199926296 A2 | 5/1999 |
| WO | 2015104084 A1 | 7/2015 |

OTHER PUBLICATIONS

International Search Report and Written Opinion for corresponding International Application No. PCT/EP2018/074908 dated Nov. 26, 2018.

Schoner et al., "(Invited) Progress in Buried Grid Technology for Improvements in on-Resistance of High Voltage SiC Devices",ECS Transactions.vol. 75, No. 12, Sep. 23, 2016 (Sep. 23, 2016), pp. 183-190.

Sung et al., On Developing One-Chip Integration of 1.2 kV SiC MOSFET and JBS Diode (JBSFET) in IEEE Transactions on Industrial Electronics, vol. 64, Issue: 10, Oct. 2017.

Sung et al., Monolithically Integrated 4H-SiC MOSFET and JBS Diode (JBSFET) Using a Single Ohmic/Schottky Process Scheme in IEEE Electron Device Letter, vol. 37, Issue 12, Dec. 2016, pp. 1605-1608.

Written Opinion of the International Preliminary Examining Authority for corresponding International Application No. PCT/EP2018/074908 dated Jul. 30, 2019.

Notice of Reasons for Refusal in counterpart JP Appl. No. 2020-537040, dated Jun. 21, 2022, 15-pgs.

\* cited by examiner

METHOD FOR MANUFACTURING A GRID

This application is a continuation of U.S. patent application Ser. No. 16/647,094 filed Mar. 13, 2020, which is a national phase of International Application No. PCT/EP2018/074908 filed Sep. 14, 2018 and published in the English language, which claims priority to Swedish Application No. 1751138-7 filed Sep. 15, 2017, both of which are hereby incorporated by reference.

TECHNICAL FIELD

The present invention relates to a cost efficient method of manufacturing an improved grid structure by combining ion implantation and epitaxial growth. The grid can be a buried grid or a surface grid.

BACKGROUND

An embedded doping structure or buried grid (BG) can be used to limit the electric field at the surface of a power semiconductor and by this, shield electric field sensitive areas like Schottky contacts or MOS structures from high electric fields in the drift layer. This is especially important for devices based on wide bandgap semiconductors like SiC, where the electric field in the device drift layers can be up to 10-times higher than in Silicon. Thus, it is important to limit the electric field at the surface of the semiconductor or the interface to other materials like the gate oxide ($SiO_2$), which can sustain a much lower critical electric field than the semiconductor.

According to the current state of the art embedded doping structures in SiC can be either produced by ion implantation or epitaxial growth. For epitaxial growth an etched grid or a trench filled grid are known.

Ion implanted BG. Advantages are that selectively doped areas can be made by masking, oxide or photoresist mask. The doping is controllable as well as homogeneity over the wafer. It is a well-known doping technique. Disadvantages are that there is a limitation in doping level due to increasing implantation damage with increasing implant dose. There is no dopant diffusion in SiC except for small atoms like boron, which gives that implanted pn-junctions are located where the implant profile ends and where implant damage is high. There is a limitation in thickness due to limitations in implantation energy, 1 µm thickness requires 400-1000 keV implantation energy depending on the implanted ions. High energy implantation is a high cost process. Implanted p-grids have low emitter efficiency due to recombination at defect centers remaining from implant damage, this leads to limited surge current capability of devices relying on that the grid pn-diode protects it against such high current levels.

Epitaxial BG—etched grid. Grow a doped epi layer, define the grid by etching and regrowth of a channel/drift layer. Advantages are that deep doped structures are possible, grid thickness is not an issue. The doping is damage free even for high concentrations of dopants. A high doping concentration is possible, close to semiconductor-semimetal transition. Disadvantages are that sharp corners of the doped grid regions result in electric field crowding thus limiting the voltage blocking capability of the device.

Epitaxial BG—trench filled grid. Perform trench etching with rounded corners followed by trench filling with epitaxial growth and subsequent planarization followed by regrowth with epitaxial growth. Advantages include that deep doped structures are possible. Grid thickness is no issue. Damage free doping is possible even for high concentrations. High doping concentration is possible, close to the semiconductor-semimetal transition. Disadvantages include that it is a complicated process involving trench etching, two times regrowth with epitaxy, and planarization with sub-micron accuracy and homogeneity which is a very costly process. Regrowth in trenches requires low growth rate, hence the process takes long time which also is a costly process.

U.S. Pat. No. 5,705,406 discloses a method for producing a semiconductor device having semiconductor layers of SiC by the use of an ion-implantation technique. It teaches to reduce the implant damage and increase dose of ion-implantation by ion-implantation at elevated temperatures. There is also disclosed how to get a thicker BG with ion implantation. There is disclosed a repeated process cycle of thin layer epi growth and ion implantation.

U.S. Pat. No. 6,897,133 discloses a method for producing a Schottky diode in silicon carbide. To avoid sharp corner of etched epitaxial BG, the epi emitter is grown in a trench etched structure with rounding as for epitaxial BG—trench filled grid described above. It is a difficult process requiring advanced etching and planarization to take away doping outside trench.

U.S. Pat. No. 8,633,560 discloses a semiconductor device. The problem with sharp corners is also known from trench grid fabrication by combining trench etching and ion-implantation, where rounded corners had to be etched.

SUMMARY

It is an object of the present invention to obviate at least some of the disadvantages in the prior art and provide an improved grid as well as a method for its manufacture.

After extensive research, it has been found that advantages can be obtained by combining ion implant techniques and epitaxial growth in silicon carbide.

In a first aspect there is provided a method for the manufacture of a grid structure in a SiC semiconductor material, said method comprising the steps of:
 a) providing a substrate comprising a doped semiconductor SiC material, said substrate comprising a first layer n1,
 b) by epitaxial growth adding at least one doped semiconductor SiC material to form separated second regions p2 on the first layer n1, if necessary with aid of removing parts of the added semiconductor material to form separated second regions p2 on the first layer n1,
 c) by ion implantation at least once at a stage selected from the group consisting of directly after step a), and directly after step b); implanting ions in the first layer n1 to form first regions p1, wherein all of the second regions p2 are in contact with a first region p1.

In a second aspect there is provided a grid structure in a semiconductor material manufactured with the method as described above.

In a third aspect there is provided a device manufactured with the method as described above. The grid is then integrated in the device.

Further aspects and embodiments are defined in the appended claims, which are specifically incorporated herein by reference.

It is possible to manufacture a buried grid with rounded corners as well as an upper part with a high doping level. The corners around the ion implanted first region p1 become rounded which avoids electric field crowding and gives a number of advantages. Further the ion implanted parts of the device are low doped which give low damage. However, the high doped part is manufactured with epitaxial growth allowing a very high doping level to be reached.

The second regions p2 with high doping allow for an efficient, low resistive Ohmic contact.

An advantage is that it is possible to manufacture a component with the ability of a faster switching due to lower resistance in the doped grid.

One advantage is that a very efficient blocking is obtained by avoiding field crowding at the grid corner and thus efficient shielding of the semiconductor surface from high electric field. This can be used to lower the resistance or increase the operating temperature.

Another advantage is that there is obtained a very efficient emission of charge carriers from the doped grid into the first layer n1 during conduction giving the capability to handle very high current levels and thus, providing improved and stable surge current capability.

Yet another advantage is that the fabrication is simplified compared to prior art avoiding expensive processes like high energy implantation, separate high-temperature annealing, and planarization with sub-micron precision.

Further for the total device process, the edge termination can be formed at the same time as the implanted p1 grid, avoiding additional costly fabrication steps.

BRIEF DESCRIPTION OF THE DRAWINGS

The invention is described with reference to the following drawings in which.

DETAILED DESCRIPTION

Figure 1:
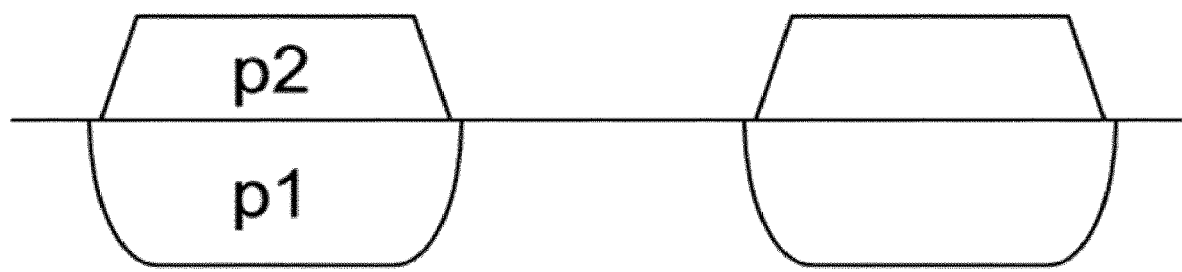
FIG. 1 shows a schematic cross-sectional view of a grid structure manufactured with the method according to the invention.
Figure 2:
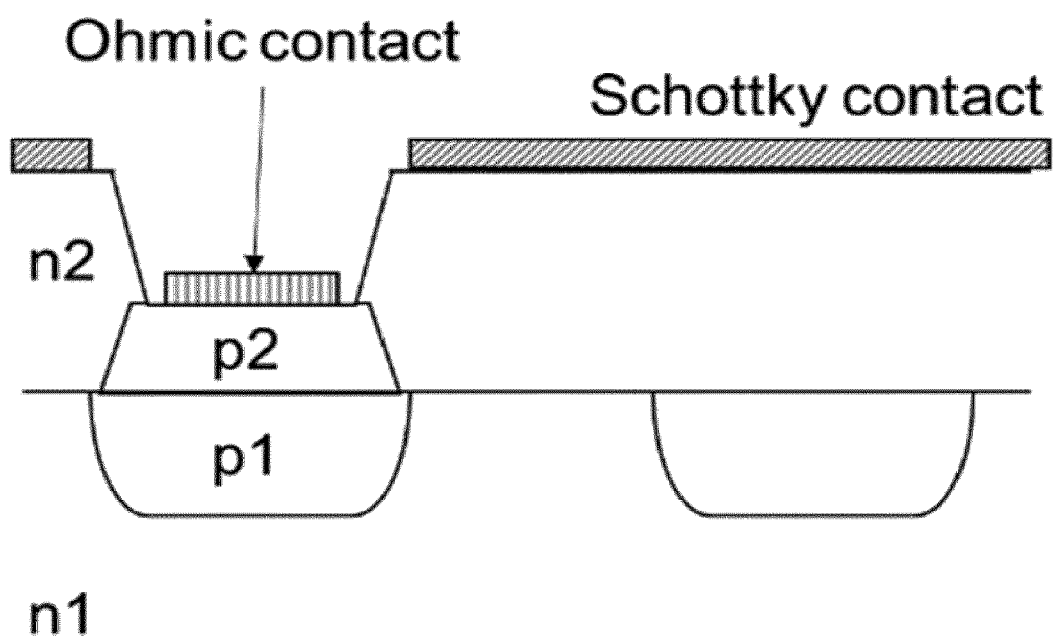
FIG. 2 shows another schematic cross-sectional view of a buried grid structure manufactured with the method according to the invention.

Before the invention is disclosed and described in detail, it is to be understood that this invention is not limited to particular compounds, configurations, method steps, substrates, and materials disclosed herein as such compounds, configurations, method steps, substrates, and materials may vary somewhat. It is also to be understood that the terminology employed herein is used for the purpose of describing particular embodiments only and is not intended to be limiting since the scope of the present invention is limited only by the appended claims and equivalents thereof.

It must be noted that, as used in this specification and the appended claims, the singular forms "a", "an" and "the" include plural referents unless the context clearly dictates otherwise.

If nothing else is defined, any terms and scientific terminology used herein are intended to have the meanings commonly understood by those of skill in the art to which this invention pertains.

"Buried grid" as used throughout the description and the claims denotes a grid structure of a material with one conductivity type in a material with the opposite conductivity type.

"Conductivity type" as used throughout the description and the claims denotes the type of conduction in a semiconductor material. N-type denotes electron conduction meaning that excess electrons move in the semiconductor giving a current flow and p-type denotes hole conduction, meaning that excess holes move in the semiconductor giving a current flow. A n-type semiconductor material is achieved by donor doping and a p-type semiconductor by acceptor dopants. In SiC, nitrogen is commonly used as donor dopant and aluminum as acceptor dopant. If a material is a doped semiconductor such as SiC, the material either has conductivity type p or conductivity type n.

A skilled person realizes that for most semiconductor devices comprising n-type and p-type doped materials, all doped materials can exchange conductivity type so that n becomes p and p becomes n. Thus also the versions where n is p-doped and p is n-doped are encompassed.

"Doped" as used throughout the description and the claims denotes that an intrinsic semiconductor such as SiC has got added impurities to modulate its electrical properties and become an extrinsic semiconductor.

"Epitaxial" as used throughout the description and the claims denotes that the material has been manufactured with epitaxial growth, in this case epitaxial growth of SiC.

"Substrate" as used throughout the description and the claims denotes a piece of material on which the power device is built up.

In a first aspect there is provided a method for the manufacture of a grid structure in a SiC semiconductor material, said method comprising the steps of:
   a) providing a substrate comprising a doped semiconductor SiC material, said substrate comprising a first layer n1,
   b) by epitaxial growth adding at least one doped semiconductor SiC material to form separated second regions p2 on the first layer n1, if necessary with aid of removing parts of the added semiconductor material to form separated second regions p2 on the first layer n1,
   c) by ion implantation at least once at a stage selected from the group consisting of directly after step a), and directly after step b); implanting ions in the first layer n1 to form first regions p1, wherein all of the second regions p2 are in contact with a first region p1.

The first layer n1 is in one embodiment a lightly doped layer. There is a substrate comprising a first layer n1, and in one embodiment the substrate comprises one or more additional layer(s). Example of an additional layer includes but is not limited to a layer of opposite doping compared to the first layer n1.

The ion implantation to form the first region p1 can be made before the second region p2 is formed on the first layer n1. However ions can also be implanted after the second region p2 is formed on top of the first layer n1. Then the ions are implanted through the second region p2 down into the first layer n1 below the second region p2 to form the first region p1.

In the above embodiment the result is a surface grid. The invention can also be utilized for the manufacture of a buried grid. In one embodiment the method further comprises a step after step c) comprising epitaxial growth growing a second layer n2 on the second regions p2 and on the first layer n1. This will give a buried grid.

There are several ways of manufacturing the grid according to the invention. In one embodiment the method further comprises a step directly after step a) comprising epitaxial growth growing a second layer n2 on the first layer n1 followed by etching through the entire second layer n2 on certain areas and wherein the subsequent step forms the separated second regions p2 on the bottom of the etched area. This also gives the same type of structures with second regions p2 on first regions p1.

In one embodiment the first layer n1 and the second layer n2 are n-doped and the first region p1 and the second region p2 are p-doped.

The grid structure is manufactured of SiC.

When parts of the layer formed in step b) are removed the layer is completely removed on selected areas so that islands constituting the second regions p2 are formed. Thus the second regions p2 become separated.

All of the second regions p2 are in contact with a first region p1, i.e. all second regions p2 have a first region p1 underneath but all first regions p1 do not necessarily have a second region p2 on top. In one embodiment all second regions p2 are aligned with a first region p1. This means that some of or all of the first regions p1 have a second region p2 on top and that such a second region p2 is aligned on a first region p1. The alignment means that the top surface of the first region p1 as seen from above matches the bottom surface of the second region p2 as seen from underneath. Top is defined as the direction in which the second region p2 is and bottom as the direction in which the first region p1 is.

In one embodiment a fraction of the first regions p1 has a second region p2 on top. In some applications, only a part of the first regions p1 have a second region p2 on top. Thus a number of first regions p1 do not have a second region p2 on top whereby the second layer n2 is directly on the first region p1.

In an alternative embodiment all first regions p1 have a second region p2 on top.

In one embodiment the contact area between the first regions p1 and second regions p2 is such that the areas of the first region p1 and the second region p2 are matching and of equal size and of equal dimensions. In an alternative embodiment the surface of the second region p2 in contact with the first region p1 is slightly smaller than the area of the first region p1 to ensure that there is no corner of the highly doped p2 which may create undesired high electrical field.

In one embodiment the epitaxial growth in step b) adds a layer with a thickness in the interval 0.1-3.0 µm. This layer thickness defines the thickness of the second regions p2.

In one embodiment the epitaxial growth in step b) utilizes Al as dopant.

In one embodiment the epitaxial growth in step b) adds at least one layer with a doping concentration in the interval 5e19-3e20 $cm^{-3}$.

In one embodiment the at least one layer added in step b) has a doping gradient with a higher doping concentration furthest away from the first region p1. The formed gradient of the second region p2 is an advantage when an Ohmic contact is to be formed directly on a second region p2.

In one embodiment the removing of the second region p2 in step b) is performed by dry etching.

In one embodiment the ion implantation is performed only before step b).

In one embodiment the ion implantation in step c) is performed only before step b) and wherein the epitaxial growth in step b) is carried out at the same time as an annealing of the implanted first regions p1. Thereby the epitaxial growth and annealing of the implanted first regions p1 are carried out in one step which simplifies the production process.

In one embodiment the ion implantation is performed with an energy of less than 350 keV. It should be kept in mind that high energy implantation is a costly process.

In one embodiment the first region p1 has a thickness in the interval 0.2-2.0 µm. The thickness of the first region p1 is determined by the ion implantation process. And to a minor extent also by subsequent annealing.

In one embodiment the first region p1 has a doping concentration in the interval 1e18-1e19 $cm^{-3}$.

In one embodiment the first region p1 has a doping gradient with a higher doping concentration towards p2. A gradient doping with the lowest doping level downwards towards n1 has the advantage of avoiding high electric fields at the pn-junction p1-n1. The higher doping level towards p2 gives a better emitter efficiency.

In one embodiment B (boron) is utilized for doping of the first region p1 and wherein the ion implantation step is followed by a diffusion step. This will give a device with lower leakage current. In one embodiment B is implanted with higher energy compared to Al.

In one embodiment at least one selected from the group consisting of Al and B is utilized for doping of the first region p1.

In one embodiment Al is utilized for doping of the second region p2 and B is utilized for doping of the first region p1.

In one embodiment, if the epitaxial growth of the second layer n2 is included in step b), it is carried out so that the thickness of the second layer n2 is in the interval 0.5-3 µm.

In one embodiment a surface planarization step is performed after growing of the second layer n2. In one embodiment CMP (chemical-mechanical planarization) is utilized for the planarization.

In one embodiment an Ohmic contact is made directly on top of at least one of the second regions p2, if necessary by partial removal of the optional second layer n2 to expose p2. The part of the second layer n2 is removed above the region(s) p2 where the Ohmic contact is to be created. This will make p2 accessible for the creation of an Ohmic contact directly on p2. In one embodiment it is not necessary to remove a part of the second layer n2 to expose p2, then an Ohmic contact can be made directly on p2 without removal of a part of second layer n2.

In one embodiment a Schottky contact is made on at least a part of the second layer (n2). For some embodiments a planarization may be required before deposition of a Schottky contact.

In one embodiment the ratio between the thickness of p2 to the spacing between two second regions p2 is below 1. The ratio between the thickness of p2 to the spacing between two second regions p2 is below 1 for all spaces between any two second regions p2. The thickness of p2 is defined as the thickness of the layer grown in step b), assuming that no material is removed from the top of the second regions p2 during step c). The spacing is the distance between two second regions p2 measured at the n1-n2 interface. The spacing between two adjacent second regions p2 is the distance from one side of a second region p2 to the nearest side of the other second region p2. In many embodiments the pattern of second regions p2 is regular with equal spacing in all directions thereby making it easy to calculate the thickness to spacing ratio. For irregular patterns a ratio can be calculated for each space and then each ratio should be below 1.

In one embodiment an edge termination of a device including the grid structure is integrated in the fabrication step c) to form the edge termination and first regions p1 at the same time.

In a second aspect there is provided a grid structure in a semiconductor material manufactured with the method as described above. It is conceived that there is a plurality of first regions p1 and second regions p2 with spaces in between forming a grid structure. In various embodiments the first regions p1 and optionally with a second region p2 on top form patterns. One example is a hexagonal pattern seen from above. Other shapes are also encompassed.

In a third aspect there is provided a device manufactured with the method as described above. The grid is then integrated in the device. One example of a device which can be made using a grid manufactured according to the method is a MOSFET. Further examples of devices which can be made using a grid manufactured according to the method include but are not limited to Schottky diodes, JFETs (Junction Field Effect Transistors), BJTs (bipolar junction transistors), and IGBTs (insulated-gate bipolar transistors).

The grid is a feature in the device to be manufactured with regularly spaced oppositely doped regions. The exact design is determined by the component or device where the grid is to be used and its voltage, current, switching frequency etc.

The invention claimed is:

1. A method for manufacture of a grid structure in a SiC semiconductor material, the method comprising the steps of:
    (a) providing a substrate comprising a doped semiconductor SiC material, the substrate comprising a first layer of a first conductivity type;
    (b) by epitaxial growth adding at least one doped semiconductor SiC material to form separated second regions of a second conductivity type opposite to the first conductivity type on the first layer;
    (c) by ion implantation at least once at a stage selected from the group consisting of after step (a) and after step (b), implanting ions in the first layer to form first regions of a second conductivity type opposite to the first conductivity type, wherein each of the separated second regions is in contact with one of the first regions; and
    (d) by epitaxial growth, growing a second layer on the separated second regions and on the first layer.

2. The method of claim 1, wherein the epitaxial growth of the second layer is carried out so that a thickness of the second layer is in an interval of 0.5 μm to 3 μm.

3. The method of claim 1, comprising performing a surface planarization step after growing of the second layer.

4. The method of claim 1, comprising making a Schottky contact on at least a part of the second layer.

5. A method for manufacture of a grid structure in a SiC semiconductor material, the method comprising the steps of:
    (a) providing a substrate comprising a doped semiconductor SiC material, the substrate comprising a first layer of a first conductivity type;
    (b) by epitaxial growth, growing a second layer on the first layer followed by etching through an entirety of the second layer on certain areas;
    (c) by epitaxial growth, adding at least one doped semiconductor SiC material at the certain areas to form separated second regions of a second conductivity type opposite to the first conductivity type on the first layer; and
    (d) by ion implantation, at least once at a stage selected from the group consisting of after step (a) and after step (b), implanting ions in the first layer to form first regions of a second conductivity type opposite to the first conductivity type, wherein each of the separated second regions is in contact with one of the first regions.

6. A method for manufacture of a grid structure in a SiC semiconductor material, the method comprising the steps of:
    (a) providing a substrate comprising a doped semiconductor SiC material, the substrate comprising a first layer of a first conductivity type;
    (b) by epitaxial growth adding at least one doped semiconductor SiC material to form separated second regions of a second conductivity type opposite to the first conductivity type on the first layer;
    (c) by ion implantation at least once at a stage selected from the group consisting of after step (a) and after step (b), implanting ions in the first layer to form first regions of a second conductivity type opposite to the first conductivity type, wherein each of the separated second regions is in contact with one of the first regions; and
    (d) making an Ohmic contact directly on top of at least one of the separated second regions.

7. The method of claim 6, wherein making the Ohmic contact directly on top of the at least one of the separated second regions further comprises partial removal of an optional second layer to expose the at least one of the separated second regions.

8. A grid structure in a semiconductor material manufactured with the method according to claim 1.

9. A device manufactured with the method according to claim 1.

10. A grid structure in a semiconductor material manufactured with the method according to claim 5.

11. A device manufactured with the method according to claim 5.

12. A grid structure in a semiconductor material manufactured with the method according to claim 6.

13. A device manufactured with the method according to claim 6.

14. A method for manufacture of a grid structure in a SiC semiconductor material, the method comprising the steps of:
    (a) providing a substrate comprising a doped semiconductor SiC material, the substrate comprising a first layer of a first conductivity type;
    (b) by epitaxial growth, adding at least one doped semiconductor SiC material to form separated second regions of a second conductivity type opposite to the first conductivity type on the first layer; and
    (c) by ion implantation, implanting ions through the separated second regions into the first layer to form first regions of a second conductivity type opposite to the first conductivity type,
    wherein each of the separated second regions is in contact with one of the first regions.

15. A grid structure in a semiconductor material manufactured with the method according to claim 14.

16. A device manufactured with the method according to claim 14.

* * * * *